US011683009B2

(12) United States Patent
Hernandez Bahlsen et al.

(10) Patent No.: US 11,683,009 B2
(45) Date of Patent: Jun. 20, 2023

(54) SOLAR, ELECTRONIC, RF RADIATOR FOR A SELF-CONTAINED STRUCTURE FOR SPACE APPLICATION ARRAY

(71) Applicant: AST & Science, LLC, Miami, FL (US)

(72) Inventors: Javier Hernandez Bahlsen, Esplugues de Llobregat (ES); Aitor Martinez De Osaba Fernandez, Barcelona (ES); Ryan D. Honour, Midland, TX (US); Abel Avellan, Coral Gables, FL (US); Huiwen Yao, Potomac, MD (US); Adam H. Halperin, Silver Spring, MD (US)

(73) Assignee: AST & Science, LLC, Miami, FL (US)

( * ) Notice: Subject to any disclaimer, the term of this patent is extended or adjusted under 35 U.S.C. 154(b) by 0 days.

(21) Appl. No.: 16/875,703

(22) Filed: May 15, 2020

(65) Prior Publication Data

US 2020/0366237 A1 Nov. 19, 2020

Related U.S. Application Data

(60) Provisional application No. 62/978,081, filed on Feb. 18, 2020, provisional application No. 62/977,864, (Continued)

(30) Foreign Application Priority Data

| Feb. 13, 2020 | (ES) | ............................... ES202030123 |
| Feb. 13, 2020 | (ES) | ............................... ES202030124 |
| Feb. 13, 2020 | (ES) | ............................... ES202030125 |

(51) Int. Cl.
*H02S 40/36* (2014.01)
*H01Q 1/28* (2006.01)
(Continued)

(52) U.S. Cl.
CPC .............. *H02S 40/36* (2014.12); *H01Q 1/286* (2013.01); *H01Q 1/288* (2013.01); *H01Q 21/0025* (2013.01); *H02S 40/30* (2014.12)

(58) Field of Classification Search
CPC ..... H02S 40/36; B64D 27/24; B64D 2211/00; B64G 1/443; H01Q 1/286; H01Q 1/288
See application file for complete search history.

(56) References Cited

U.S. PATENT DOCUMENTS

| 4,063,246 A | * 12/1977 | Greiser ................ H01Q 9/0407 |
|  |  | 343/700 MS |
| 4,843,397 A | 6/1989 | Galati et al. |

(Continued)

FOREIGN PATENT DOCUMENTS

| CN | 103731935 A | 4/2014 |
| EP | 3109659 A1 | 12/2016 |
| GB | 2536017 A | 9/2016 |

OTHER PUBLICATIONS

International Search Report far PCT/US20/33225, dated Aug. 12, 2020, 13 pages.

(Continued)

*Primary Examiner* — Andrea Lindgren Baltzell
*Assistant Examiner* — Amal Patel
(74) *Attorney, Agent, or Firm* — Shumaker & Sieffert, P.A.

(57) ABSTRACT

An array of antenna assemblies each generate solar power and utilize the generated solar power at that antenna assembly, which enables large amounts of power to be generated. An antenna assembly having a flat antenna layer forming a first outer surface of said antenna assembly, a flat solar layer forming a second outer surface of said antenna assembly, and a flat structural layer having a flat support structure sandwiched between the antenna layer and the solar layer. The antenna layer has a flat antenna plate with one or more
(Continued)

antennas at the first outer surface of the antenna assembly to communicate with Earth. The solar layer has a flat solar plate with one or more solar cells at the second outer surface of the antenna assembly to receive solar energy and generate power.

24 Claims, 3 Drawing Sheets

Related U.S. Application Data filed on Feb. 18, 2020, provisional application No. 62/977,860, filed on Feb. 18, 2020, provisional application No. 62/848,317, filed on May 15, 2019.

(51) Int. Cl.
  *H02S 40/30* (2014.01)
  *H01Q 21/00* (2006.01)

(56) References Cited

U.S. PATENT DOCUMENTS

| | | | |
|---|---|---|---|
| 5,196,857 A | 3/1993 | Chiappetta et al. | |
| 5,465,096 A | 11/1995 | Nawata | |
| 5,666,127 A * | 9/1997 | Kochiyama | H01Q 21/061 343/853 |
| 5,810,297 A | 9/1998 | Basuthakur | |
| 5,909,299 A | 6/1999 | Sheldon, Jr. et al. | |
| 5,925,092 A | 7/1999 | Swan et al. | |
| 6,087,991 A * | 7/2000 | Kustas | H01Q 1/38 244/172.7 |
| 6,157,642 A | 12/2000 | Sturza et al. | |
| 6,314,269 B1 | 11/2001 | Hart | |
| 6,590,150 B1 | 7/2003 | Kiefer | |
| 6,923,249 B1 | 8/2005 | Porter | |
| 6,975,582 B1 | 12/2005 | Karabinis | |
| 6,990,314 B1 | 1/2006 | Hagen | |
| 7,357,356 B1 | 4/2008 | Goodzeit | |
| 8,736,108 B1 | 5/2014 | Nielson et al. | |
| 8,757,554 B1 | 6/2014 | Harvey et al. | |
| 9,150,313 B2 | 10/2015 | Puig-Suari et al. | |
| 9,248,924 B2 | 2/2016 | Puig-Suari et al. | |
| 9,473,234 B2 | 10/2016 | Shreve et al. | |
| 9,570,795 B1 | 2/2017 | Bruce et al. | |
| 9,664,726 B2 | 5/2017 | Platzer et al. | |
| 9,673,889 B2 | 6/2017 | Platzer et al. | |
| 9,815,573 B2 | 11/2017 | Woods | |
| 9,973,266 B1 | 5/2018 | Avellan et al. | |
| 2001/0034206 A1 | 10/2001 | Thompson | |
| 2002/0102939 A1 | 8/2002 | Shaneyfelt | |
| 2005/0248491 A1 | 11/2005 | Leyre et al. | |
| 2007/0155318 A1 | 7/2007 | Monte | |
| 2007/0184778 A1 | 8/2007 | Mechaley | |
| 2007/0250267 A1 | 10/2007 | Jaeger | |
| 2008/0055177 A1 | 3/2008 | Dixon | |
| 2008/0087769 A1 | 4/2008 | Johnson | |
| 2008/0122690 A1 | 5/2008 | Wan | |
| 2010/0046853 A1 | 2/2010 | Goodnough | |
| 2011/0023484 A1 | 2/2011 | Lu et al. | |
| 2011/0063189 A1 | 3/2011 | Cohen et al. | |
| 2012/0217348 A1 | 8/2012 | Aguirre Martinez | |
| 2012/0287018 A1 | 11/2012 | Parsche | |
| 2012/0325974 A1 | 12/2012 | Baudasse et al. | |
| 2013/0009851 A1 | 1/2013 | Danesh | |
| 2013/0113996 A1 | 5/2013 | Zhu | |
| 2013/0148696 A1 | 6/2013 | Ryu | |
| 2014/0266872 A1 | 9/2014 | Mitola, III | |
| 2015/0162656 A1 | 6/2015 | Fitz-Coy et al. | |
| 2015/0180114 A1 | 6/2015 | Achour | |
| 2015/0217876 A1 | 8/2015 | Haisband | |
| 2015/0249462 A1 | 9/2015 | Chang | |
| 2015/0371431 A1 | 12/2015 | Korb | |
| 2016/0011318 A1 | 1/2016 | Cohen | |
| 2016/0056321 A1 | 2/2016 | Atwater et al. | |
| 2016/0065006 A1 | 3/2016 | Woods | |
| 2016/0251092 A1 | 9/2016 | Cappaert et al. | |
| 2016/0253284 A1 | 9/2016 | Cappaert et al. | |
| 2017/0043885 A1 | 2/2017 | Marchandise et al. | |
| 2017/0070939 A1 | 3/2017 | Chong et al. | |
| 2017/0099095 A1 | 4/2017 | Wang | |
| 2017/0214144 A1 | 7/2017 | Cohen et al. | |
| 2017/0250751 A1 | 8/2017 | Kargieman | |
| 2017/0254905 A1 | 9/2017 | Reis | |
| 2017/0285178 A1 | 10/2017 | Piatzer | |
| 2017/0300654 A1 | 10/2017 | Stein | |
| 2019/0238216 A1 | 8/2019 | Avellan et al. | |

OTHER PUBLICATIONS

International Search Report for PCT/US20/33231, dated Aug. 11, 2020, 16 pages.
Examination Report for EP Application No. 17192639.7, dated Sep. 28, 2018, 5 pages.
International Search Report and Written Opinion for PCT/US18/36929, dated Aug. 31, 2018, 11 pages.
Rainey K., "CubeSats: Shaping Possibilities in Space," Feb. 22, 2017, https://www.nasa.gov/mission_pages/station/research/news/cubesats_possibilites, 3 pages.
Williams, K., "Nasa Small Satellites to Demonstrate Swarm Communications and Autonomy," Dec. 7, 2015, https://www.nasa.gov/feature/nasa-small-satellites-to-demonstrate-swarm-communications-and-autonomy, 2 pages.
Gaudin S., "Swarms of smart nano-satellites may offer global conneclivity (with video)," Sep. 15, 2015, Computerworld, https://www.computerworld.com/article/2983637/emerging-technology-swarms-of-smart-nano-satellites-may-offer-global-connectivity-with-video-html, 6 pages.
"ISRO sets new world record, successfully puts 104 satellites into Earth's orbit," India TV News Desk, Feb. 15, 2017, http://www,.indiatvnews.com/news/india-countdown-begins-india-to-launch-record-104-satellites-on-single-rocket-368925, 8 pages.
Konechy G., "Small Satellites—A tool for Earth observation?" Jan. 2004, https://www.researchgate.net/publication/229028414_Small_satellites-A tool_for_Earth_observation?, 4 pages.
Nodes—Spacecraft network operations demonstration using multiple spacecraft in an autonomously configured space network allowing crosslink communications and multipoint scientific measurements, National Aeronautics and Space Administration, www.nasa.gov, Aug. 1, 2016, 2 pages.
International Search Report and Written Opinion for PCT/US2020/033221, dated Sep. 28, 2020.

\* cited by examiner

SOLAR, ELECTRONIC, RF RADIATOR FOR A SELF-CONTAINED STRUCTURE FOR SPACE APPLICATION ARRAY

RELATED APPLICATIONS

This application claims the benefit of priority of U.S. Application No. 62/848,317 filed on May 15, 2019, Spanish Application No. 202030123, filed on Feb. 13, 2020, and U.S. Application No. 62/977,864 filed on Feb. 18, 2020. This application also claims priority to Spanish Application No. 202030124, filed on Feb. 13, 2020, Spanish Application No. 202030125, filed Feb. 13, 2020, U.S. Application No. 62/977,860, filed Feb. 18, 2020, and U.S. Application No. 62/978,081, filed Feb. 18, 2020. The content of those applications is relied upon and incorporated herein by reference in their entireties. The present application further incorporates by reference the content of U.S. application Ser. No. 16/875,646, titled Low Earth Orbit Mechanical Deployable Structure, filed May 15, 2020, and U.S. application Ser. No. 16/875,738, titled Thermal Management System for Structures in Space, filed May 15, 2020.

BACKGROUND

U.S. Pat. No. 9,973,266 and U.S. Publ. No. 2019/0238216 show a system for assembling a large number of small satellite antenna assemblies in space to form a large array. The entire content of the '266 patent is incorporated herein by reference. As disclosed in the '266 patent, FIGS. 1(a), 1(b) show a satellite communication system 100 having an array 300 of small satellites 302 and a central or control satellite 200. The small satellites 302 communicate with end users 500 within a footprint 400 on Earth, and also communicate with the control satellite 200, which in turn communicates with a gateway 600 at a base station. The small satellites 302 can each include, for example, a processing device (e.g., a processor or controller) and one or more antenna elements. And the control satellite 200 can include a processing device and one or more antenna or antenna elements.

SUMMARY

An antenna assembly having a flat antenna layer forming a first outer surface of said antenna assembly, a flat solar layer forming a second outer surface of said antenna assembly, and a flat structural layer having a flat support structure sandwiched between the antenna layer and the solar layer. The antenna layer has a flat antenna plate with one or more antennas at the first outer surface of the antenna assembly to communicate with Earth. The solar layer has a flat solar plate with one or more solar cells at the second outer surface of the antenna assembly to receive solar energy and generate power.

DETAILED DESCRIPTION

Figure 1A:
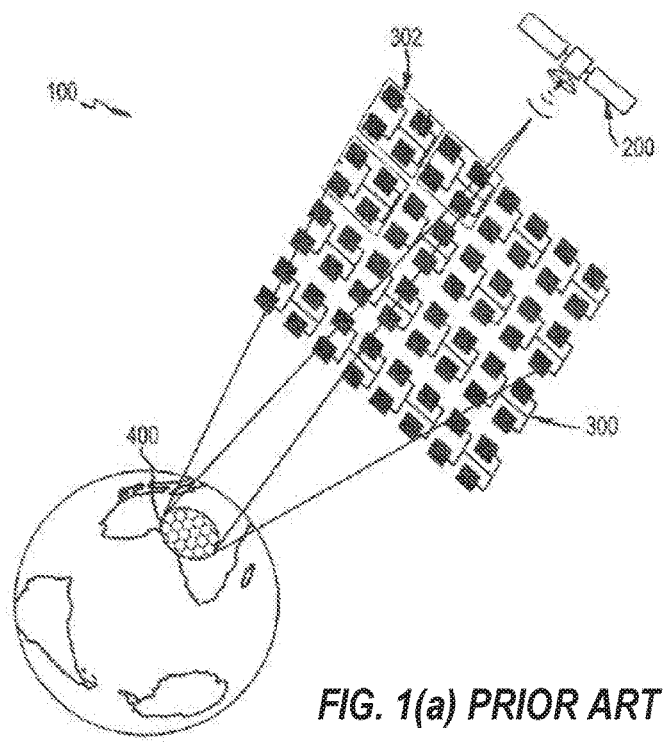
FIGS. 1(a), 1(b) show a conventional structural array.

In describing the illustrative, non-limiting embodiments of the disclosure illustrated in the drawings, specific terminology will be resorted to for the sake of clarity. However, the disclosure is not intended to be limited to the specific terms so selected, and it is to be understood that each specific term includes all technical equivalents that operate in similar manner to accomplish a similar purpose. Several embodiments of the disclosure are described for illustrative purposes, it being understood that the disclosure may be embodied in other forms not specifically shown in the drawings.

Figure 1B:
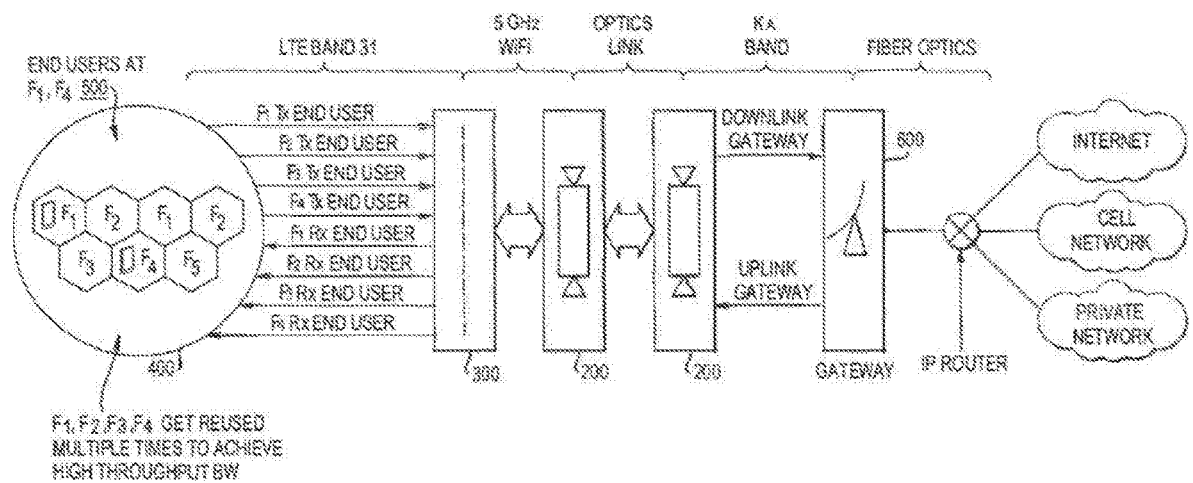

Turning to the drawings, FIGS. 2-5 show a structural assembly, here an antenna assembly 310, in accordance with one example embodiment of the disclosure. The antenna assembly 310 can be utilized in any satellite system, such as the satellite communication system 100 of FIGS. 1(a), 1(b). The antenna assembly 310 can also be utilized separately by itself or for other purposes than for an antenna or communications.

In one embodiment, the antenna assembly 310 is configured to be utilized in combination with a plurality of antenna assemblies to form a large antenna array in space. The individual antenna assemblies 310 are structurally and/or electrically coupled together in great numbers to form a large structure in space, such as the array 300 of FIGS. 1(a), 1(b). The array has a stowed or storage configuration, and a deployed or operating configuration. The plurality of antenna assemblies are transported into space in a stowed configuration. In the stowed configuration, the antenna assemblies 310 are in a compact arrangement, such as being folded upon each other in a stacked manner. Once in space, the antenna assemblies are moved into the deployed configuration, where they are unfolded with respect to one another and expand outward to be substantially planar with one another. Each satellite array has a plurality of satellite module assemblies 310 that are mechanically connected together by one or more connectors 376. The plurality of satellite module assemblies can be connected in space to form the single large phase array having a single orbital inclination and/or single aperture.

The antenna assembly 310 has a first outer layer 320, a middle layer 350, and a second outer layer 380. The first outer layer 320 is an aluminum reflector that retains the antenna elements, and is sometimes referred to here as the RF (radio frequency) layer or antenna layer. The middle layer 350 is a support structure such as a lightweight, rigid honeycomb. The second outer layer 380 is a solar panel having one or more solar cells that collect solar energy from the Sun, and is sometimes referred to here as the solar layer. The antenna assembly 310 is configured for the RF layer 320 to be closest to the Earth so that the antenna elements are nadir facing (face the Earth) to best communicate with user devices on the ground without any interference or obstruction (i.e., no physical interference by the antenna assembly, and no or reduced electrical interference from other electronic devices at the antenna assembly). In addition, the solar layer 380 is zenith facing (faces away from the Earth) and collects solar energy from the Sun and generates power from the solar energy that can be utilized to power electronic components on the antenna assembly 310.

Each antenna assembly 310 has a circuit or component assembly 360 (FIG. 5) and a structural assembly (FIGS.

2-4). The component assembly 360 includes an antenna 332, and an electronic circuit. The electronic circuit can include a variety of one or more electronic components including, for example, a processing device such as processor 362, cables 366, FEM 370, and/or a power supply, such as a battery or batteries 364. The structural assembly houses and supports the component assembly 360 and can include, for example, the outer layers 320, 380, the middle layer 350, and accompanying structural elements. Though certain elements are described as being part of the circuit assembly and other elements as part of the structural assembly, the elements can be considered part of the other assembly or both the circuit assembly and the structural assembly.

RF Layer 320

Figure 2:
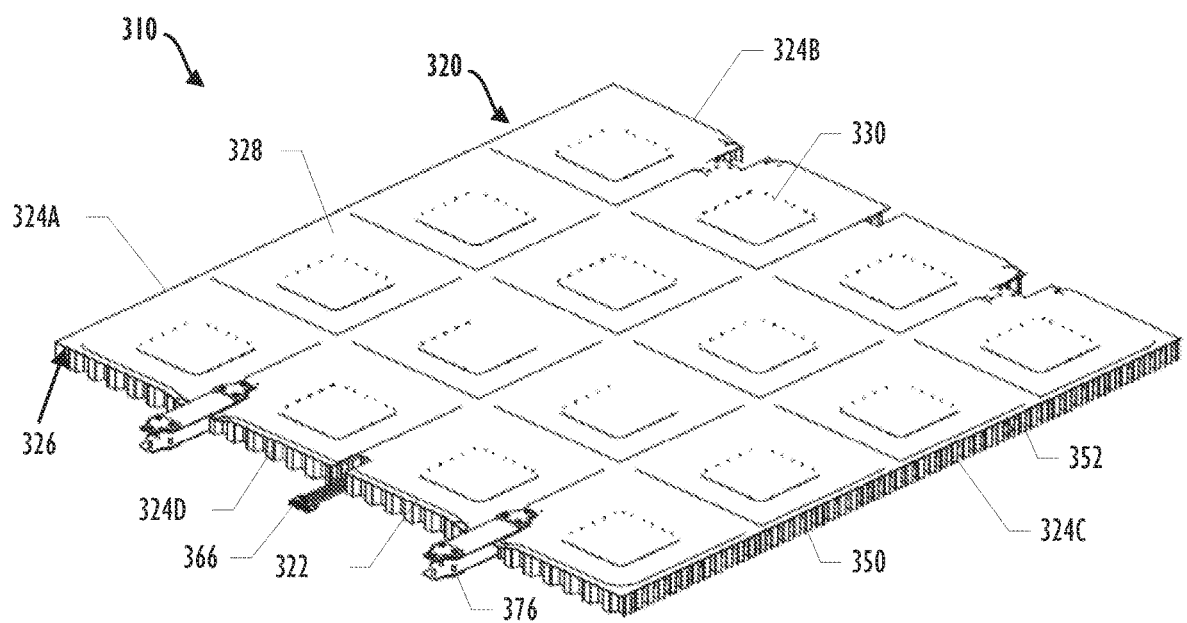
FIG. 2 is a perspective view of the RF side of the antenna assembly without the antenna elements.
Figure 3:
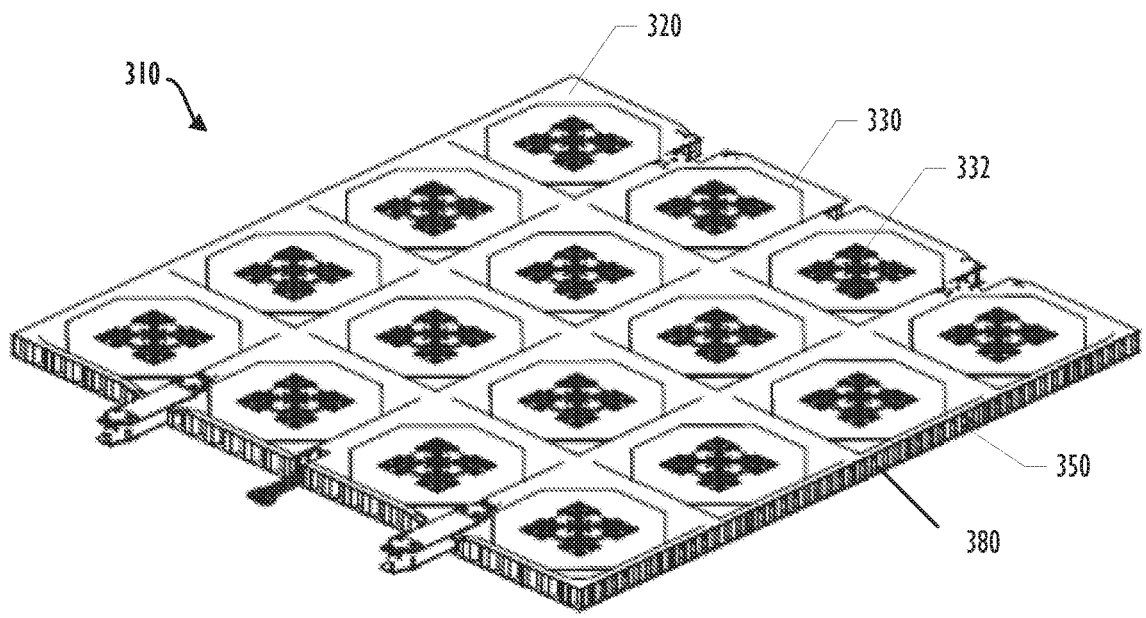
FIG. 3 is a perspective view of the RF side of the antenna assembly with the antenna elements.

The RF layer 320 is best shown in FIGS. 2, 3. The RF layer 320 has a body 322 and receives a plurality of antenna 332 used to communicate with another satellite, a base station, or user devices on Earth. The body 322 has a rectangular or square shape with four sides 324a, 324b, 324c, 324d, an outward-facing surface 328 and an inward-facing surface 326. The body 322 is formed as a thin flat conductive plate and is lightweight. In one example, the body is made of aluminum to form an antenna ground. One or more antennas 332 are mounted to the body 322. The body 322 provides sufficient structure and support for the antennas 332 to be mounted to the body 322, yet is lightweight. The RF layer 320 also operates as a thermal reflector to disperse heat throughout the antenna assembly 310.

One or more recesses or pockets 330 are provided in the body 322 of the RF layer 320. In the example embodiment shown in the figures, there are a plurality of pockets 330 aligned in rows and columns, here shown as a 4×4 array. The pockets 330 extend inward from the outward facing surface 328 toward the inward facing surface 326. Accordingly, the pockets 330 form a recess on the outward-facing surface 328 of the body 322, and project slightly outward from the inward-facing surface 326 of the body. The pockets 330 can have an octagon shape with eight sides, as shown in FIG. 3, or can have any suitable shape such as square (as shown in FIG. 2), rectangular, or circular.

An antenna 332 is received and mounted in each of the pockets 330 to form an array of antennas 332, here a 4×4 array of 16 antennas 332. The antenna 332 can have a substrate, such as a printed circuit board, and one or more antenna elements mounted on the substrate. The antenna elements communicate signals, for example RF signals, to and from the antenna assembly 310. In the example of FIG. 3, each antenna 332 has four antenna elements interconnected with one another, though more or fewer can be provided depending on the application. The antennas 332 fill the pocket 330 recess and are aligned to be flush with the outward-facing surface 328 of the RF layer 320. Accordingly, the antenna elements face outward from the outward-facing surface 328 of the RF layer 320, which is also the outer-facing surface of the entire antenna assembly 310.

The outward-facing surface 328 is substantially planar, so that the antenna elements are also planar with one another. The plurality of antenna elements from the plurality of antennas 332 all face the Earth without obstruction or interference. When the antenna assembly 310 is connected in an array of a plurality of antenna assemblies, the antenna elements combine with each other and with the antenna elements in the entire antenna assembly array, which is substantially planar, to form a large antenna structure in space. In accordance with one embodiment of the present disclosure, in the deployed configuration the antenna assemblies 310 form a contiguous uniform uninterrupted surface so that the sides 324 come into contact with one another to form a single contiguous uniform and planar surface without gaps between adjacent antenna assemblies 310. The first layer 310 also serves as a reflector to provide a ground for the antennas, and as a radiator.

Solar Layer 380

Figure 4:
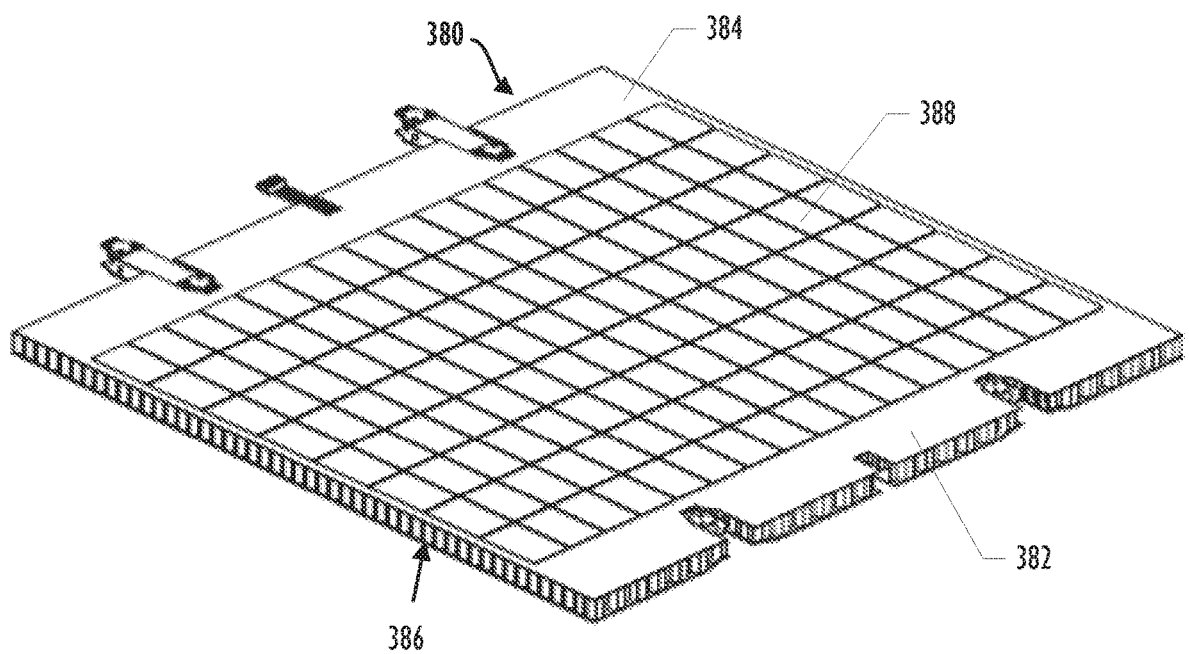
FIG. 4 is a perspective view of the solar side of the antenna assembly.
Figure 5:
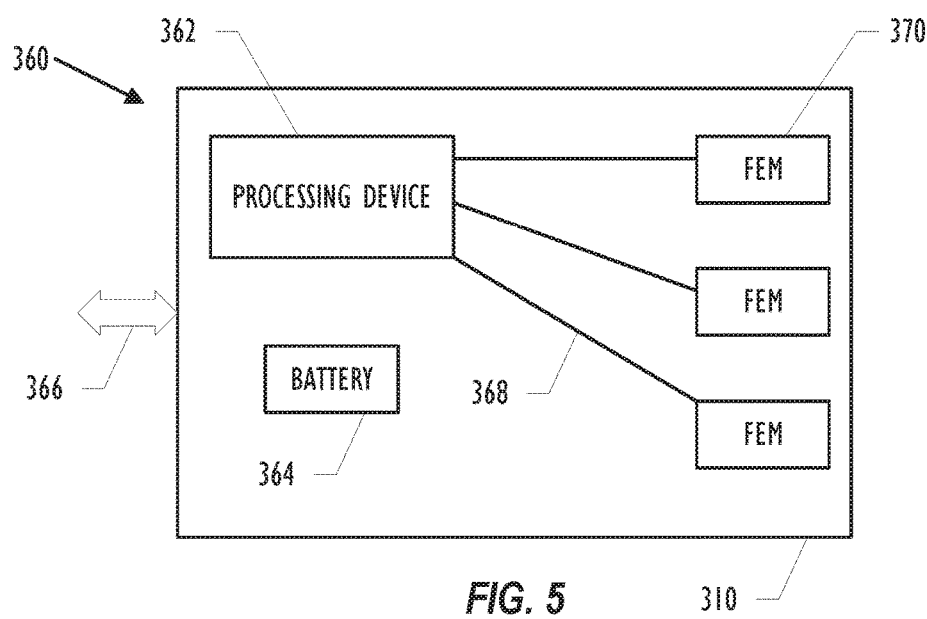
FIG. 5 is a block diagram of the antenna assembly.

Referring to FIG. 4, the solar layer 380 has a body 382 with a rectangular or square shape with four sides, an outward-facing surface 384 and an inward-facing surface 386. The body is formed as a thin flat conductive plate and is lightweight. In one example, the body is made of aluminum to form an antenna ground. One or more solar cells 388 are mounted to the outward-facing surface 384 of the solar layer 380, i.e., at the side of the antenna assembly 310 that faces away from the Earth. The body 382 provides sufficient structure and support for the one or more solar cells to be mounted to the body 382, and is lightweight.

The solar cells 388 collect solar energy to generate solar power that is the primary power source to power the circuit assembly of the antenna assembly 310. The battery 364 forms a secondary or backup power supply in the event the solar cells do not generate sufficient power, and can be rechargeable batteries that are charged by the solar cells 120 when the solar cells 120 generate excess power.

Each solar layer 380 generates solar power locally at the antenna assembly 310. When the antenna assemblies 310 are utilized in an array of antenna assemblies 310, the power scales up to generate large amounts of power, e.g., over 100 kW of DC power and up to hundreds of kilowatts of DC power. The array is modular and scalable by adding more antenna assemblies 310. The more antenna assemblies 310 that are provided in the array, the greater the power. In addition, the antenna assemblies 310 not only generate power (via the solar layer 380) locally at each antenna assembly 310, but the power is used locally at that same antenna assembly 310 where the power is generated. For example, the power is used by electronic components, such as the processing device 362, antenna 332, and Front End Modules (FEMs) 370.

The solar cell 388 can be positioned on the surface that faces away from the Earth; here, the outer-facing surface 384 of the solar layer 380. The solar cell receives solar energy from the Sun, especially when the antenna assembly 310 is between the Earth and the Sun. Thus, the RF side 320 faces toward Earth, and the opposite solar side 380 faces away from Earth. In one embodiment, the antenna assembly 310 can angle more directly toward the Sun during certain times in the orbit. The solar energy can be utilized to power the electronic components of the array, assembly 310, or for array thrust. For example, the solar cell 388 can be made from photovoltaic material or other material that converts solar energy to electrical energy to operate as a solar panel, and also operate as an antenna structure (or other structure of the satellite or satellite module 310) to transmit and receive signals in accordance with the present disclosure. The electrical energy is used to power the satellite or satellite modules 310 or stored for later use. Thus, the same structure can be used for solar energy and for operation as a satellite antenna.

Middle Layer 350

As shown in FIG. 3, the middle layer 350 is positioned between the RF layer 320 and the solar layer 380. The middle layer 350 provides strength and rigidity to the antenna assembly 310, and houses the electronic components that operate the antenna 332 at the RF layer 320. In particular, the RF layer 320 and the solar layer 380 are formed of metal plates for the respective bodies 322, 382 with a thickness that is minimized to be lightweight. Because those layers 320, 380 are kept thin, they may lack sufficient strength to maintain the structure of the antenna assembly 310 and prevent the antenna assembly 310 from bending or flexing. It is important, however, that the antenna assembly 310 be sufficiently rigid to permit proper operation of the antennas 332 and of the antenna assembly 310.

Accordingly, the middle layer 350 has a support structure 352 that provides some flexibility but is sufficiently rigid to prevent the antenna assembly 310 from bending or flexing to an extent that might otherwise render the antenna assembly 310 inoperable or deteriorate the operation of the antenna assembly 310. Thus, the support structure 352 is lightweight and rigid to provide structural support and stiffness to the antenna assembly 310. In addition, the support structure 352 is lightweight, which is important for space applications and to reduce the weight for transport into space. In one example embodiment, the support structure 352 can be any suitable material and structure, such as a honeycomb structure from Nomex.

The middle layer 350 also houses the component assembly 360 that operate the antennas 332. The component assembly 360 is situated in openings formed in the support structure 352. The component assembly 360 can include, for example, a processing device 362, battery 364, wires or cables 366, 368, and a Front-End Module (FEM) 370. For example, the honeycomb structure of the middle layer 350 can include a separate opening that each respectively receive an individual component of the component assembly 360. That is, the processor 362 can be received in a first opening and the battery 364 can be received in a second opening. Thus, the components of the component assembly 360 are housed inside the antenna assembly 310, between the outer RF layer 320 and the outer solar layer 380. One or more of the components can be situated closer to one of the outer layers 320, 380. For example, the FEM 370 can be positioned closer to the RF layer 320 to be adjacent each respective antenna 332, or can be positioned closer to the solar layer 380 to avoid interference with the antenna 332. And, the processor 362 can be positioned closer to the solar layer 380 to avoid heating the antenna 332, or can be positioned closer to the RF layer 320 to avoid heat from the solar layer 380.

The component assembly 360 can also include heat dissipation components or heat spreaders such as, for example, heat pipes to distribute heat from one local spot to another to spread the heat along the aluminum reflector 320. The heat pipes can also distribute heat from the solar panel 380 throughout the antenna assembly 310, such as to each FEM 370. The heat pipes operate by thermal conduction, though any suitable heat dissipation device can be provided other than heat pipes and need not include pipes. The heat dissipation components operate thermally and need not be controlled by the processor 362, though other heat dissipation components can be provided and the processor 362 can control the amount of heat transferred by the heat dissipation components. The heat dissipation components distribute heat throughout the antenna assembly 310, but can also distribute heat from one antenna assembly 310 to an adjacent antenna assembly 310.

The processing device 362 can be, for example, a processor or computing device. The processing device 362 controls and manages operation of the antenna assembly 310. For example, the processor 362 can control the signals that are transmitted and/or received over the antennas 332. The processor 362 can also control operation of the batteries 364, such as for example to direct solar energy to the battery 364 and from the battery 364 to the various components, such as via the solar pipes. The battery 364 stores energy and is charged by the solar panel 380 to be used in the electronics. The wires 366 are hi-speed cables that connect one antenna assembly 310 to adjacent antenna assemblies 310. The hi-speed cables 366 interconnect antenna assemblies 310 for synchronization between the antenna assemblies and to share power between the antenna assemblies 310.

The wire 368 are RF cables that connect the FEM 370 to the processor 362 to provide electrical communication between the FEM 370 and the processor 362. The FEM 370 is the electronics behind the antenna 332, and can include for example a transmitter and/or receiver. The FEM 370 is positioned in alignment with the antennas 332 and connect with the antennas 332 through openings in the first layer 320. A separate FEM 370 can be provided for each respective antenna 332, whereby each FEM 370 is aligned with the respective antenna 332. Or, one FEM 370 can be provided for multiple antennas 332. The antenna 332 is at the outside of the antenna assembly 310 at the outer-facing surface 328 of the outer RF layer 320. And the FEM 370 is inside the antenna assembly 310 at the middle layer 350 between the outer RF layer 320 and the outer solar layer 380.

In addition, when the antenna assembly 310 is formed as part of an array of a plurality of antenna assemblies 310, one or more connectors 376 (FIG. 2) are provided at one or more sides 324 of the antenna assembly 310. The connectors 376 can be connected to the support structure 352, or to one or both of the outer layers 320, 380, or other suitable structure of the antenna assembly 310, such as for example by one or more fasteners or adhesive. The connectors 376 can include hinges, tape springs, and the like, which rotatably connect the antenna assembly 310 to the neighboring antenna assembly 310. Thus, the antenna assembly can be folded onto a neighboring antenna assembly to which it is connected in a stowed configuration, or unfolded and planar with the neighboring antenna assembly in a deployed configuration.

Antenna Assembly 310

The antenna assembly 310 is a Low-Earth Orbit (LEO) structure. In the embodiments described above, the antenna assembly 310 has an antenna 332 with antenna elements. However, the antenna assembly 310 can be utilized for any suitable purpose and have any suitable electronic components, and need not have an antenna 332 or antenna elements. The antenna assembly 310 houses electronic components at the middle layer 350 so that they do not interfere with the antennas 332 at the outward-facing surface 328 of the RF layer 310. The solar layer 380 provides solar energy to operate the electronic components. In addition, thermal insulation can be provided that retains heat received by the solar panel, at the interior of the antenna assembly. Thus, the power and processing are distributed throughout the array, i.e., the solar energy is collected (by the solar cell) at each antenna assembly 310 and consumed (by the electronic components) locally (at that same antenna assembly 310), and the processing is provided at each antenna assembly 310 rather than at a centrally located processing device.

The RF layer 320, middle layer 350, and solar layer 380 all have a similar shape. Though the shape shown in the figures is square, other suitable shapes can be utilized such as rectangular or triangular. In combination, those layers 320, 350, 380 form a relatively thin flat rectangular or square structure with a first outward-facing surface 328 formed by the RF layer 320 and a second outward-facing surface 384 formed by the solar layer 380. The middle layer 350 is sandwiched between the RF layer 320 and the solar layer 380. The layers 320, 350, 380 can be connected together in any suitable manner, for example by a fastener, resin or adhesive material that connects all of the layers 320, 350, 380 or connects adjacent layers. The bodies 332, 382 are made as thin as possible that still allows the bodies 332, 382 to support the respective antenna and solar cell, so that they are lightweight. However, the thinness makes those bodies 332, 382 flexible. The middle layer 350 provides the needed rigidity to prevent unwanted bending and flexing of the antenna assembly 310, but the middle layer 350 is made of lightweight material. The RF layer 320, middle layer 350, and solar layer 380 all have planar outer surfaces that are parallel to each other.

It is noted that the antenna assembly 310 does not include a separate housing. Rather, the layers 320, 350, 380 are connected to each other, including that the electronic layer 320 is directly connected to the middle layer 350, and the middle layer 350 is directly connected to the solar layer 380. The antenna assembly 310 forms a single unitary integral member. However, the antenna assembly 310 can also be/part of or attached to a separate discrete structural device, such as a radome, housing or frame. The housing can at least partially surround or enclose the layers 320, 350, 380.

The antenna assemblies 310 (e.g., antennas 332 or antenna elements) communicate with processing devices on Earth, such as for example a user device (e.g., cell phone, tablet, computer) and/or a ground station. The present disclosure also includes the method of utilizing the antenna assemblies 310 to communicate (i.e., transmit and/or receive signals to and/or from) with processing devices on Earth. The present disclosure also includes the method of processing devices on Earth communicating (i.e., transmit and/or receive signals to and/or from) with the antenna assemblies 310. In addition, the antenna assemblies 310 can be used in Low Earth Orbit (LEO) or in other orbits or for other applications. Sill further, while the disclosure has been described as for an array of antenna assemblies, the disclosure can be utilized for other applications, such as for example data centers, reflectors, and other structures, both implemented in space or terrestrially.

It is further noted that the present disclosure can be utilized separately, and can also be utilized in combination with the systems and methods disclosed in U.S. application Ser. No. 16/875,646, titled Low Earth Orbit Mechanical Deployable Structure, filed May 15, 2020, and U.S. application Ser. No. 16/875,738, titled Thermal Management System for Structures in Space, filed May 15, 2020, the entire contents of which are incorporated herein by reference. Thus, for example, the structure of the antenna assembly 310 can be self-deployable, as shown and described in the LEO Mechanical Deployable Structure application, and/or can utilize the thermal management as shown and described in the Thermal Management application.

It is further noted that the description and claims use several geometric or relational terms, such as planar, parallel, circular, flush, and flat. In addition, the description and claims use several directional or positioning terms and the like, such as top, bottom, inward, outward, distal, and proximal. Those terms are merely for convenience to facilitate the description based on the embodiments shown in the figures, and are not intended to limit the disclosure. Thus, it should be recognized that the disclosure can be described in other ways without those geometric, relational, directional or positioning terms. In addition, the geometric or relational terms may not be exact. For instance, antenna assembly and the array of antenna assemblies may not be exactly planar with one another but still be considered to be substantially planar because of, for example, tolerable bending or flexing allowed for operation that still permits operation. And, other suitable geometries and relationships can be provided without departing from the spirit and scope of the disclosure.

The foregoing description and drawings should be considered as illustrative only of the principles of the disclosure, which may be configured in a variety of ways and is not intended to be limited by the embodiment herein described. Numerous applications of the disclosure will readily occur to those skilled in the art. Therefore, it is not desired to limit the disclosure to the specific examples disclosed or the exact construction and operation shown and described. Rather, all suitable modifications and equivalents may be resorted to, falling within the scope of the disclosure.

The invention claimed is:

1. An antenna assembly comprising:
a solar layer comprising one or more solar cells that are configured to generate solar power;
an antenna layer connected to the solar layer, the antenna layer comprising a body that is unitary, the body comprising an outward facing surface;
electronic components that are configured to utilize the solar power; and
a support layer sandwiched between the solar layer and the antenna layer,
wherein the body defines a plurality of recesses, and each recess of the plurality of recesses is defined by a portion of the body that extends inward from the outward facing surface, and
wherein each of the plurality of recesses receives at least one of the electronic components on the portion of the body that extends inward from the outward facing surface.

2. An antenna assembly array comprising a plurality of antenna assemblies, each antenna assembly of the plurality of antenna assemblies comprising the antenna assembly according to claim 1,
wherein the plurality of antenna assemblies are connected together to form the antenna assembly array, and
wherein each of the antenna assemblies are configured to generate the solar power and are configured to utilize the solar power of the plurality of antenna assemblies.

3. A method for communicating comprising at least one of transmitting or receiving signals to or from the antenna assembly of claim 1.

4. The antenna assembly of claim 1, wherein the electronic components include a plurality of antennas.

5. The antenna assembly of claim 1, wherein the body is a metal plate.

6. The antenna assembly array of claim 2, wherein each antenna assembly of the plurality antenna assemblies is coupled to at least one other antenna assembly with one or more connectors.

7. The antenna assembly of claim 1, wherein each recess of the plurality of recesses comprises a pocket in the body, and each electronic component of the electronic components is received and mounted in the pocket of a corresponding recess.

8. The antenna assembly of claim 1, wherein the body comprises an inward facing surface and each recess of the plurality of recesses projects from the inward facing surface.

9. An antenna assembly comprising:
an antenna layer that is flat, the antenna layer comprising a body that is unitary, the body comprising a first outer surface of the antenna assembly;
a plurality of antennas at the first outer surface of the antenna assembly;

a solar layer that is flat, the solar layer comprising a second outer surface of the antenna assembly, the solar layer having a solar plate that is flat and that comprises one or more solar cells at the second outer surface of the antenna assembly; and a structural layer that is flat, the structural layer comprising a support structure that is flat and that is sandwiched between the antenna layer and the solar layer, wherein the body defines a plurality of recesses, and each recess of the plurality of recesses is defined by a portion of the body that extends inward from the first outer surface, and wherein each recess of the plurality of recesses is configured to receive at least one antenna of the plurality of antennas on the portion of the body that extends inward from the first outer surface.

10. The antenna assembly of claim 9, wherein the structural layer is rigid.

11. The antenna assembly of claim 9, wherein the support structure comprises a honeycomb pattern.

12. The antenna assembly of claim 9, wherein the support structure is sandwiched between the antenna layer and the solar plate.

13. The antenna assembly of claim 9, further comprising one or more front end modules, each front end module of the one or more front end modules associated with an antenna of the plurality of antennas.

14. The antenna assembly of claim 9, wherein each antenna of the plurality of antennas comprises one or more antenna elements.

15. The antenna assembly of claim 9, wherein each antenna of the plurality of antennas is configured to communicate with user devices on Earth.

16. The antenna assembly of claim 9, wherein the one or more solar cells are configured to generate power that is to be utilized by the plurality of antennas.

17. The antenna assembly of claim 9, further comprising a processing device that is configured to operate the plurality of antennas.

18. The antenna assembly of claim 17, wherein the one or more solar cells are configured to generate power that is to be utilized by the processing device.

19. The antenna assembly of claim 9, wherein the first outer surface is configured to face Earth.

20. The antenna assembly of claim 19, wherein the plurality of antennas are configured to communicate with user devices on Earth without obstruction or interference from the antenna assembly.

21. The antenna assembly of claim 9, wherein the support structure is configured to house one or more components that are configured to operate the plurality of antennas.

22. The antenna assembly of claim 21, wherein the components include at least one of a processor, power supply, or a front end module.

23. The antenna assembly of claim 9, wherein each recess of the plurality of recesses comprises a pocket in the body, and the plurality of antennas are received and mounted in the pocket of a corresponding recess.

24. The antenna assembly of claim 9, wherein the body comprises an inward facing surface and each recess of the plurality of recesses projects from the inward facing surface.

* * * * *